US011473211B2

(12) United States Patent
Matsukuma et al.

(10) Patent No.: US 11,473,211 B2
(45) Date of Patent: Oct. 18, 2022

(54) METHOD OF ESTIMATING OXYGEN CONCENTRATION OF SILICON SINGLE CRYSTAL AND METHOD OF MANUFACTURING SILICON SINGLE CRYSTAL

(71) Applicant: SUMCO CORPORATION, Tokyo (JP)

(72) Inventors: Shin Matsukuma, Tokyo (JP);
Kazuyoshi Takahashi, Tokyo (JP);
Toshinori Seki, Tokyo (JP); Tegi Kim, Tokyo (JP); Ryusuke Yokoyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/971,155

(22) PCT Filed: Feb. 27, 2019

(86) PCT No.: PCT/JP2019/007444
§ 371 (c)(1),
(2) Date: Aug. 19, 2020

(87) PCT Pub. No.: WO2019/167988
PCT Pub. Date: Sep. 6, 2019

(65) Prior Publication Data
US 2020/0407870 A1 Dec. 31, 2020

(30) Foreign Application Priority Data
Feb. 28, 2018 (JP) .............................. JP2018-035829

(51) Int. Cl.
*C30B 15/22* (2006.01)
*C30B 29/06* (2006.01)
(52) U.S. Cl.
CPC .............. *C30B 15/22* (2013.01); *C30B 29/06* (2013.01)

(58) Field of Classification Search
CPC ........ C30B 15/206; C30B 15/22; C30B 29/06
See application file for complete search history.

(56) References Cited

U.S. PATENT DOCUMENTS 5,882,402 A * 3/1999 Fuerhoff ................. C30B 15/26
117/201
6,004,393 A 12/1999 Maeda et al.
(Continued)

FOREIGN PATENT DOCUMENTS

CN 1738931 A 2/2006
CN 105506731 A 4/2016
(Continued)

OTHER PUBLICATIONS

Official Communication issued in International Bureau of WIPO Patent Application No. PCT/JP2019/007444, dated May 7, 2019.
(Continued)

*Primary Examiner* — Hua Qi
(74) *Attorney, Agent, or Firm* — Greenblum & Bernstein, P.L.C.

(57) ABSTRACT

A method of estimating an oxygen concentration in monocrystalline silicon, which is pulled up by a pull-up device having a hot zone with a plane-asymmetric arrangement with respect to a plane defined by a crystal pull-up shaft and an application direction of a horizontal magnetic field, includes, in at least one of a neck-formation step or a shoulder-formation step for the monocrystalline silicon: a step of measuring a surface temperature of a silicon melt at a point defining a plane-asymmetric arrangement of a hot zone, and a step of estimating the oxygen concentration in a straight body of the pulled-up monocrystalline silicon based on the measured surface temperature of the silicon melt and a predetermined relationship between the surface (Continued)

temperature of the silicon melt and the oxygen concentration in the monocrystalline silicon.

4 Claims, 12 Drawing Sheets

(56) References Cited

U.S. PATENT DOCUMENTS

| | | | | |
|---|---|---|---|---|
| 2008/0127886 | A1* | 6/2008 | Sasaki | C30B 15/14 117/217 |
| 2010/0288185 | A1* | 11/2010 | Filar | C30B 15/14 117/13 |
| 2016/0083864 | A1* | 3/2016 | Kimbel | C30B 15/002 117/215 |

FOREIGN PATENT DOCUMENTS

| | | | |
|---|---|---|---|
| EP | 0874069 | B1 | 12/1997 |
| JP | 10-291892 | | 11/1998 |
| JP | 10291892 | A * | 11/1998 ............ C30B 15/20 |
| JP | 2001-2492 | | 1/2001 |
| JP | 2001002492 | A * | 1/2001 |
| JP | 2004-323322 | | 11/2004 |
| JP | 2016-98147 | | 5/2016 |
| KR | 10-1998-0079537 | A | 11/1998 |
| TW | 531574 | B | 5/2003 |
| TW | 200923144 | A | 6/2009 |
| TW | 201802977 | A | 1/2018 |

OTHER PUBLICATIONS

Office Action for TW App. No. 108106610, dated Nov. 13, 2019 (w/ translation).
IPRP for PCT/JP2019/007444, dated Sep. 1, 2020.
Office Action for KR App. No. 10-2020-7025037, dated Nov. 26, 2021, (w/translation).
Office Action for CN App. No. 201980015966.3, dated Dec. 23, 2021, (w/ translation).

* cited by examiner

METHOD OF ESTIMATING OXYGEN CONCENTRATION OF SILICON SINGLE CRYSTAL AND METHOD OF MANUFACTURING SILICON SINGLE CRYSTAL

TECHNICAL FIELD

The present invention relates to a method of estimating oxygen concentration in monocrystalline silicon, and a manufacturing method of monocrystalline silicon.

BACKGROUND ART

A method called Czochralski method (hereinafter, referred to as CZ method) is used for manufacturing monocrystalline silicon. In the CZ method, for instance, a material in a form of polycrystalline silicon received in a quartz crucible is melted by a heater (e.g. a resistance heater) in an inert gas (Ar) atmosphere under reduced pressure.

After the material is melted, a seed crystal is dipped in a silicon melt whose temperature is approximately the melting point of silicon (seed-melt contact step), and liquid temperature is adjusted so that the seed crystal is compatible with the silicon melt. After being compatible with the silicon melt, the seed crystal is pulled up while the diameter of the seed crystal is reduced to approximately 5 mm in order to eliminate dislocations in the seed crystal (neck-formation step).

After the diameter of the seed crystal is reduced during the neck-formation step, the crystal diameter is conically enlarged (i.e. to form a cone) while the liquid temperature and a pull-up speed are adjusted until a product diameter is reached (shoulder-formation step). After the crystal diameter reaches the product diameter, a predetermined length of a to-be-product portion is vertically grown (straight-body-formation step). Then, the crystal diameter is conically reduced (tail-formation step) and, when the diameter is sufficiently reduced, the crystal is separated from the melt to end the crystal formation.

It has been desired in such CZ method to estimate a temperature distribution of the monocrystalline silicon being pulled up to produce high-quality monocrystalline silicon.

In order to meet the demand, Patent Literature 1 discloses a method for estimating a temperature of monocrystalline silicon through general heat transfer analysis, in which two or more temperature distribution patterns under different heating conditions are measured in a direction of a central axis of a silicon melt, and turbulence parameters are adjusted so that the two or more temperature distribution patterns in the direction of the central axis of the silicon melt match temperature distribution patterns in the central axis of the silicon melt obtained through the general heat transfer analysis, which takes three-dimensional convection in the respective heating conditions into consideration.

CITATION LIST

Patent Literature(s)

Patent Literature 1 JP 2016-98147 A

SUMMARY OF THE INVENTION

Problem(s) to be Solved by the Invention

However, the estimation of the temperature of the monocrystalline silicon through the general heat transfer analysis as disclosed in Patent Literature 1 cannot sufficiently improve an accuracy of the estimation because there are some patterns of convection at the time of actually pulling up the monocrystalline silicon.

An object of the invention is to provide a method capable of determining a pattern of convection in a silicon melt, and thus capable of highly accurately estimating oxygen concentration in monocrystalline silicon, and a manufacturing method of monocrystalline silicon.

Means for Solving the Problem(s)

A method of estimating an oxygen concentration in monocrystalline silicon according to an aspect of the invention includes: pulling up the monocrystalline silicon from a silicon melt in a quartz crucible while applying a horizontal magnetic field to the silicon melt, the monocrystalline silicon being pulled up by a pull-up device including a hot zone with a plane-asymmetric arrangement with respect to a plane defined by a crystal pull-up shaft and an application direction of the horizontal magnetic field; in at least one of a neck-formation step or a shoulder-formation step of the monocrystalline silicon, measuring a temperature of a surface of the silicon melt at a point defining the plane-asymmetric arrangement of the hot zone; and estimating the oxygen concentration in a straight body of the pulled-up monocrystalline silicon based on the measured temperature of the surface of the silicon melt and a predetermined relationship between the temperature of the surface of the silicon melt and the oxygen concentration in the monocrystalline silicon.

While the monocrystalline silicon is being pulled up, convection, whose flow circulates between a bottom of the quartz crucible and the surface of the silicon melt, occurs in the silicon melt. While the horizontal magnetic field is not applied, the convection flow rotates clockwise or anticlockwise along a rotation direction of the quartz crucible as viewed from above the quartz crucible. When the horizontal magnetic field is applied in this state, the clockwise/anticlockwise rotation is restrained, so that the rotation of the convection flow from the bottom of the quartz crucible to the surface of the silicon melt is fixed clockwise or anticlockwise.

When the direction of the flow of inert gas at a point with a low flow rate of the inert gas on the surface of the silicon melt in the pull-up device, whose hot zone is plane-asymmetric with respect to the plane defined by the crystal pull-up shaft of the pull-up device and the application direction of the horizontal magnetic field, is opposite to the rotation direction of the convection flow, the flow of the inert gas is directed, in contrast, in the same direction as the rotation direction of the convection flow at a point with high flow rate of the inert gas.

Accordingly, when the direction of the flow of the inert gas at the point with the high flow rate of the inert gas is the same as the rotation direction of the convection flow, the convection flow in the silicon melt is accelerated to promote agitation of a high-oxygen-concentration part of the silicon melt at the bottom to increase the oxygen concentration in the pulled-up monocrystalline silicon.

In contrast, when the flow of the inert gas goes opposite the rotation direction of the convection flow at the point in the plane-asymmetrically arranged hot zone with the high flow speed of the inert gas on the surface of the silicon melt, the inert gas flows in a direction for cancelling the rotation speed of the convection flow, thereby restraining the silicon melt from being agitated and decreasing the oxygen concentration in the monocrystalline silicon.

As described above, the rotation direction of the convection flow in the silicon melt can be known by measuring the surface temperature of the silicon melt at the point with low flow speed of the inert gas. Accordingly, the oxygen concentration in the pulled-up monocrystalline silicon can be highly accurately estimated based on the predetermined relationship between the surface temperature of the silicon melt and the oxygen concentration in the monocrystalline silicon.

In the above aspect of the invention, the plane-asymmetric arrangement of the hot zone is optionally achieved by providing a cut portion in a part of a heat shield spaced from the surface of the silicon melt.

According to the above arrangement, the part with low flow speed of the inert gas on the surface of the silicon melt can be formed only by providing the cut portion in a part of the heat shield. Accordingly, the plane-asymmetric arrangement of the hot zone can be easily achieved.

Further, with the plane-asymmetric arrangement of the hot zone defined by the cut portion, the point with low flow speed of the inert gas can be visually recognized from an outside, facilitating the measurement of the surface temperature of the silicon melt.

In the above aspect of the invention, the plane-asymmetric arrangement of the hot zone is optionally defined by changing a height of a part of a heat shield from a liquid surface, the heat shield being spaced from the surface of the silicon melt.

The height of the heat shield from the liquid surface can be changed by thickening a vertical dimension of a part of the heat shield or providing a step portion.

According to the above arrangement, the part with low flow speed of the inert gas on the surface of the silicon melt can be also formed only by thickening the vertical dimension of a part of the heat shield. Accordingly, the plane-asymmetric arrangement of the hot zone can be easily achieved.

A method according to another aspect of the invention is for manufacturing monocrystalline silicon by pulling up the monocrystalline silicon from a silicon melt in a quartz crucible while applying a horizontal magnetic field to the silicon melt, the method including: performing the method of estimating an oxygen concentration in monocrystalline silicon according to the above aspect of the invention; and pulling up the monocrystalline silicon after adjusting at least one of a rotation speed of the quartz crucible of the pull-up device, a flow rate of inert gas, or a pressure in a furnace based on the estimated oxygen concentration in the monocrystalline silicon.

According to the above aspect of the invention, the same functions and effects as described above can be achieved.

BRIEF DESCRIPTION OF DRAWING(S)

FIG. 1 schematically shows an arrangement of a pull-up device, whose hot zone is plane-asymmetrically configured, according to a first exemplary embodiment of the invention.

FIG. 2 is a plan view schematically showing the arrangement of the pull-up device, whose hot zone is plane-asymmetrically configured, according to the first exemplary embodiment.

FIG. 3 schematically shows a change in a convection flow in a silicon melt in the first exemplary embodiment.

FIG. 4 schematically shows a flow of argon gas in the pull-up device, whose hot zone is plane-asymmetrically configured, according to the first exemplary embodiment.

Figure 8:
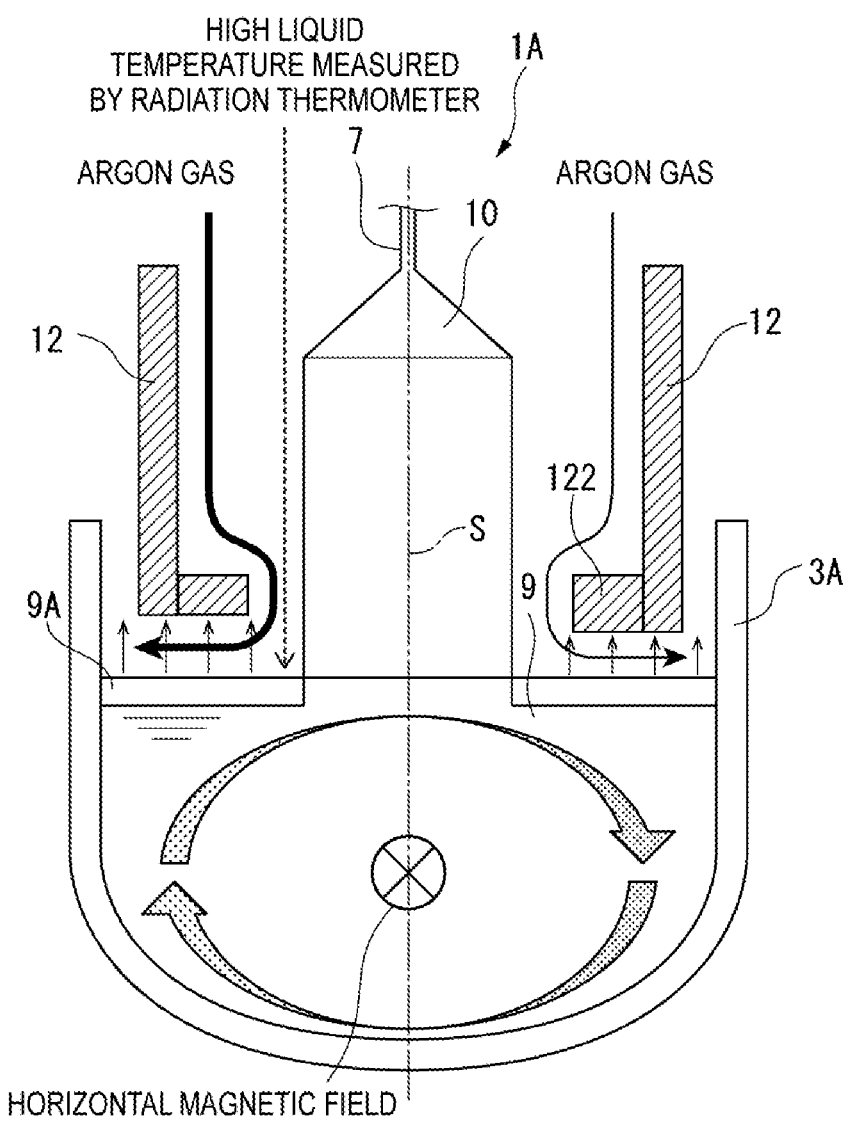

FIG. 8 schematically shows an arrangement of a pull-up device, whose hot zone is plane-asymmetrically configured, according to a second exemplary embodiment of the invention.

Figure 9:
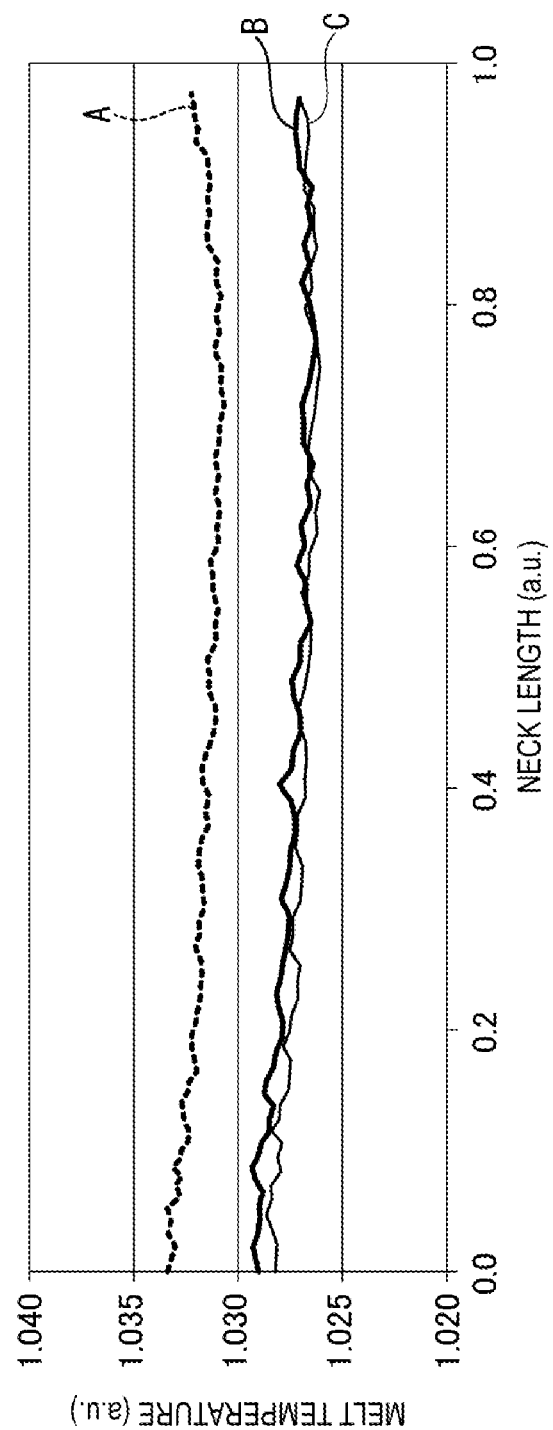

FIG. 9 is a graph showing a relationship between the neck length and a surface temperature of the silicon melt in Example(s) and Comparative(s) of the invention.

Figure 10:
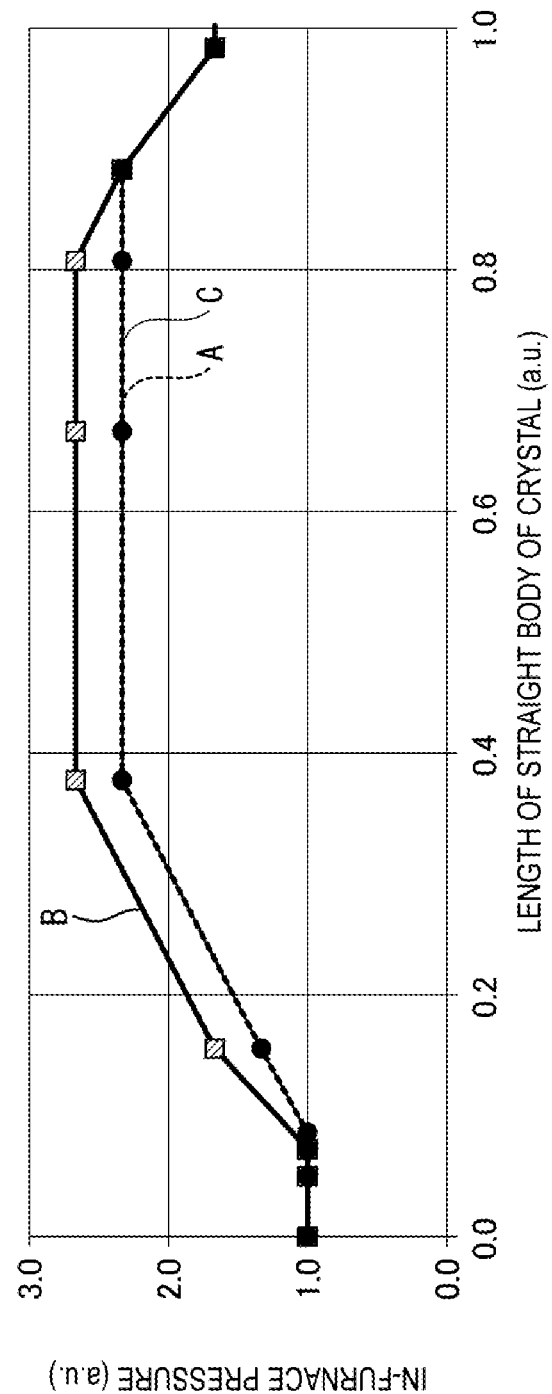

FIG. 10 is a graph showing a method of adjusting pull-up conditions in Example(s) and Comparative(s) of the invention.

Figure 11:
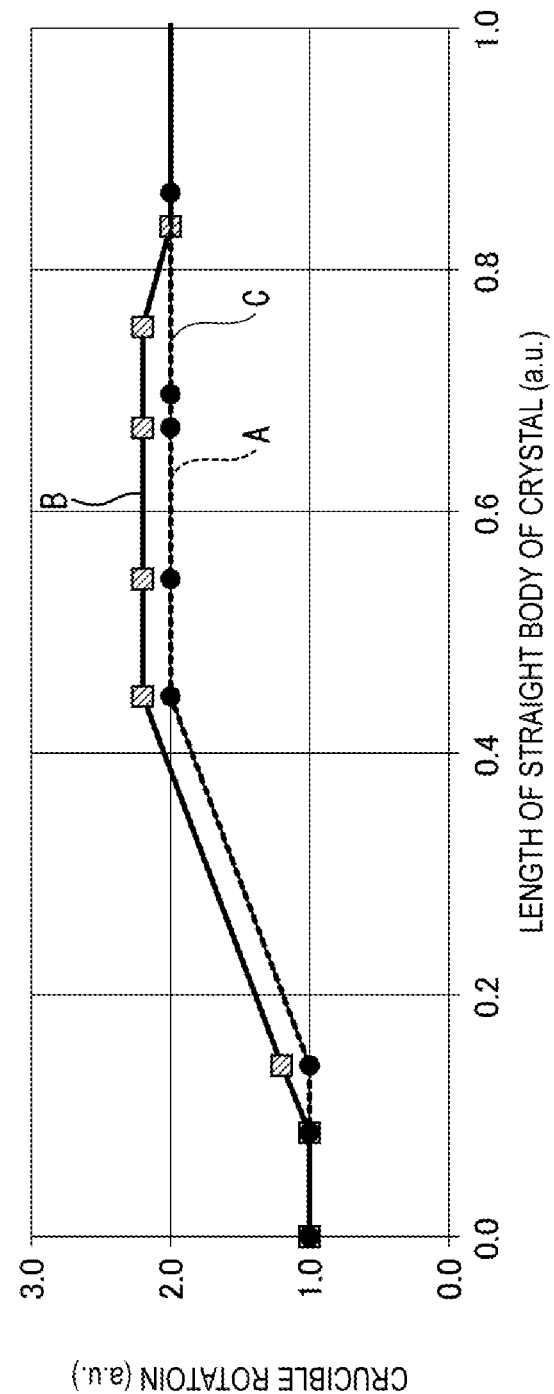

FIG. 11 is another graph showing the method of adjusting pull-up conditions in Example(s) and Comparative(s) of the invention.

Figure 12:
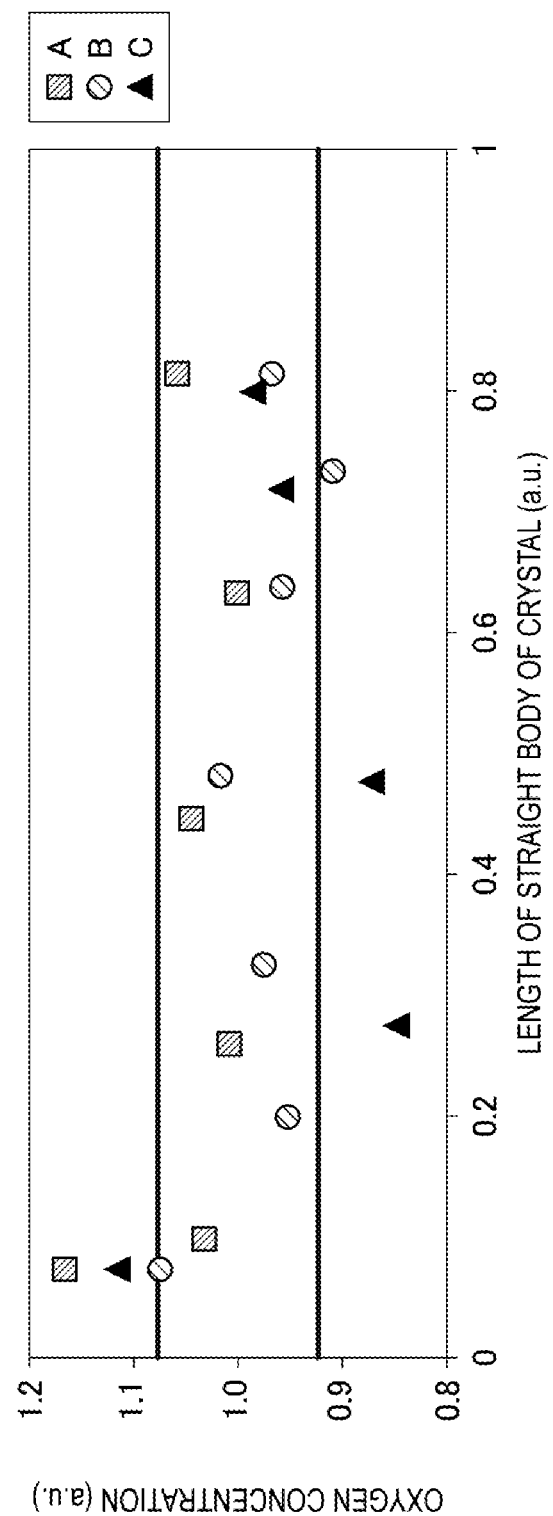

FIG. 12 is a graph showing a relationship between the length of the straight body and the oxygen concentration in monocrystalline silicon in Example(s) and Comparative(s) of the invention.

DESCRIPTION OF EMBODIMENT(S)

Exemplary embodiments of the invention will be described below with reference to the attached drawings.

[1] First Exemplary Embodiment

Figure 1:
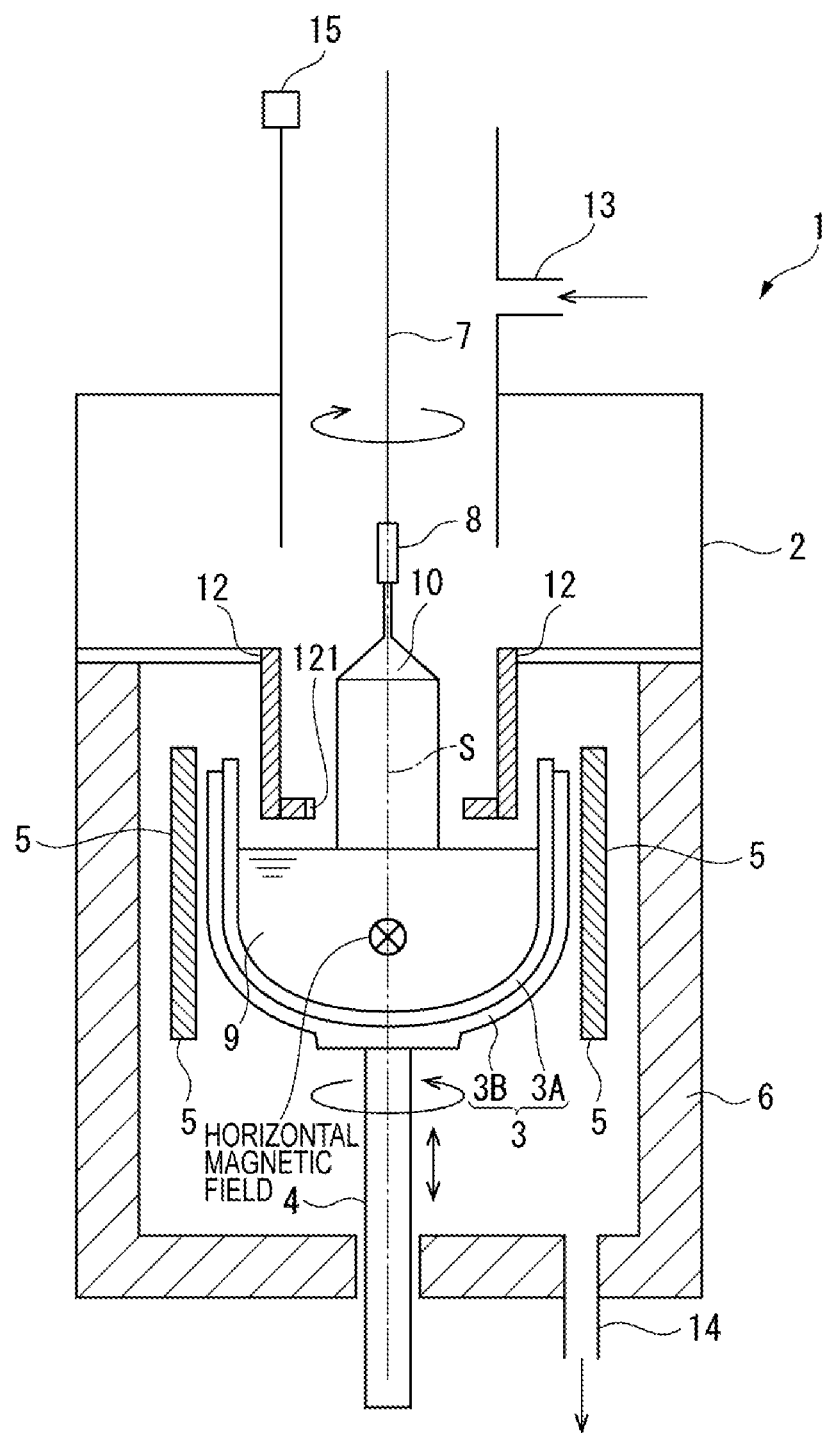
Figure 2:
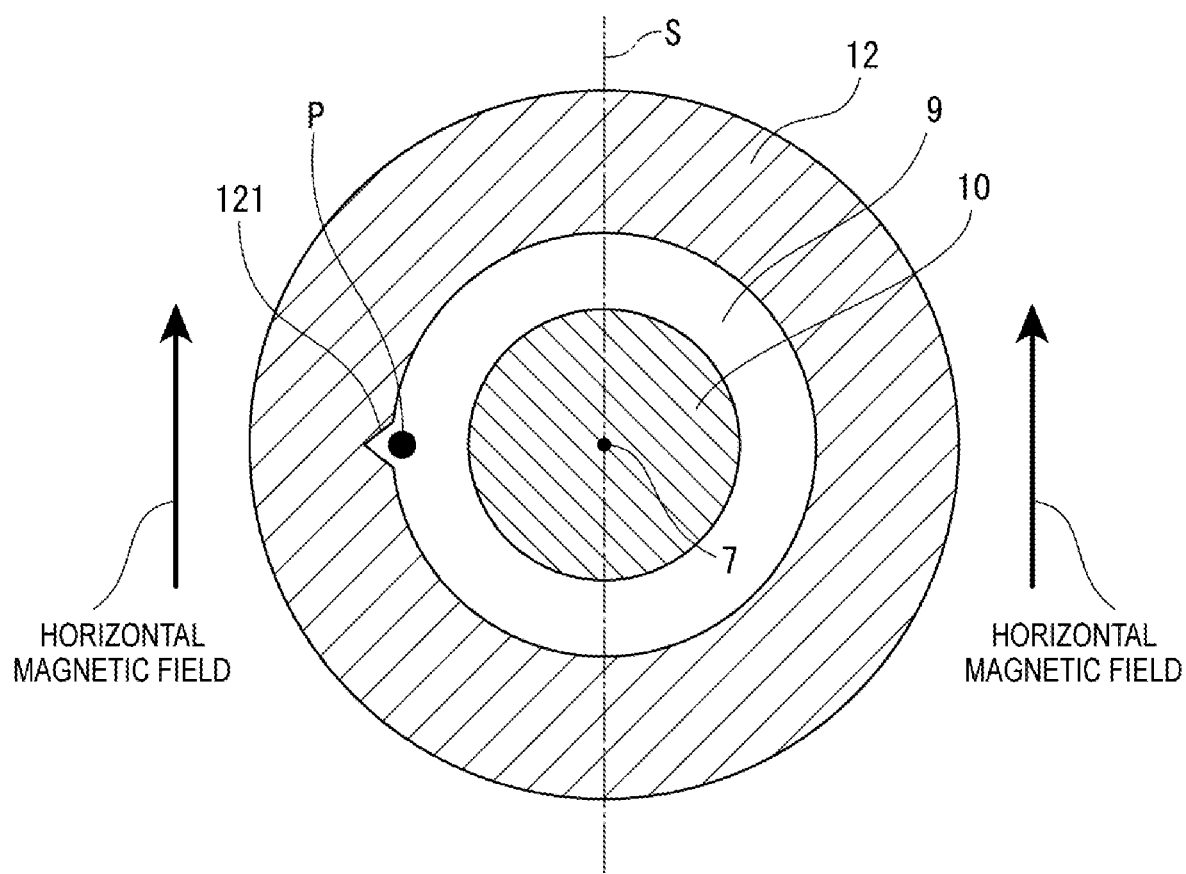

FIGS. 1 and 2 schematically illustrate an exemplary structure of a pull-up device 1 of monocrystalline silicon, to which a manufacturing method of monocrystalline silicon 10 according to a first exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2.

A crystal pull-up shaft 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the crystal pull-up shaft 7.

The heat shield 12, which shields the growing monocrystalline silicon 10 from high-temperature radiation heat from the silicon melt 9 in the crucible 3, the heater 5 and a side wall of the crucible 3, also prevents outward heat diffusion from a solid-liquid interface (i.e. an interface on which crystal grows) and a vicinity thereof, whereby the heat shield 12 serves to control a temperature gradient of a central portion and an outer peripheral portion of the monocrystalline silicon in a direction of the pull-up shaft.

Moreover, the heat shield 12 also serves as a current regulation cylinder for exhausting substances evaporated from the silicon melt 9 to the outside of the furnace by inert gas introduced from the top of the furnace.

A gas inlet 13, through which an inert gas (e.g. Argon gas, sometimes referred to as "Ar gas" hereinafter) is introduced into the chamber 2, is provided at an upper part of the chamber 2. An exhaust outlet 14, through which the gas in the chamber 2 is sucked and discharged when a vacuum pump (not shown) is driven, is provided at a lower part of the chamber 2.

The inert gas introduced in the chamber 2 through the gas inlet 13, which flows downward between the growing monocrystalline silicon 10 and the heat shield 12 and then flows into a space between a lower end of the heat shield 12 and a liquid surface of the silicon melt 9, flows toward an outside of the heat shield 12 and an outside of the crucible 3 and then downward along the outside of the crucible 3, to be discharged from the exhaust outlet 14.

A horizontal magnetic field is applied to the pull-up device 1. Magnetic field line of the horizontal magnetic field extends in a direction orthogonal to the sheet of FIG. 1. A cut portion 121 is provided at a lower end on the left side of the heat shield 12 to provide a hot zone that is plane-asymmetrically configured with respect to a plane S defined by an application direction of the magnetic field line of the horizontal magnetic field and the crystal pull-up shaft 7.

In addition, a radiation thermometer 15, which is configured to measure a surface temperature of a measurement point P (see FIG. 2) of the silicon melt 9 near the cut portion 121 in a non-contact manner, is provided at an upper part of the chamber 2 immediately above the cut portion 121 as shown in FIG. 1.

The Ar gas supplied through the gas inlet 13 is directed toward the surface of the silicon melt 9 and then toward the outside of the quartz crucible 3A along the liquid surface. At this time, the flow speed of the Ar gas flowing through the part provided with the cut portion 121 is lowered due to an enlarged gap by the presence of the cut portion 121. In contrast, the flow speed of the Ar gas flowing through the part not provided with the cut portion becomes high because the gap is kept small.

When the monocrystalline silicon 10 is manufactured using the pull-up device 1 as described above, while the inside of the chamber 2 is kept in an inert gas atmosphere under reduced pressure, the solid material such as polycrystalline silicon having been put in the crucible 3 is melted with heat from the heater 5 to produce the silicon melt 9.

After the silicon melt 9 is produced in the crucible 3, the crystal pull-up shaft 7 is lowered to dip the seed crystal 8 in the silicon melt 9. Subsequently, while the crucible 3 and the crystal pull-up shaft 7 are rotated in a predetermined direction, the crystal pull-up shaft 7 is gradually pulled up to grow the monocrystalline silicon 10 connected with the seed crystal 8.

[2] Background for Invention

The inventors have known that, even if the monocrystalline silicon 10 is pulled up using the same pull-up device 1 under the same pull-up conditions, an oxygen concentration in the pulled-up monocrystalline silicon 10 may sometimes become high or low. In order to solve this problem, a research has been typically focused on the pull-up conditions and the like. However, no definitive solution has been found.

After further research, the inventors have found that, after a solid polysilicon feedstock is put into the quartz crucible 3A to be melted, a convection flow rotating in a direction from the bottom of the quartz crucible 3A toward the surface of the silicon melt 9 around the magnetic field lines of the horizontal magnetic field is observable in the process of pulling up the monocrystalline silicon 10 while the horizontal magnetic field is applied. The convection flow exhibits two convection patterns, a clockwise rotation being dominant in one of the convection patterns and an anticlockwise rotation being dominant in the other of the convection patterns.

The inventors have speculated that the occurrence of such a phenomenon is due to the following mechanism.

First, while the horizontal magnetic field is not applied and the quartz crucible 3A is not rotated as shown in FIG. 3(A), the silicon melt 9 is heated in the vicinity of an outer periphery of the quartz crucible 3A, causing a convection flow in an ascending direction from the bottom toward the surface of the silicon melt 9. The ascending silicon melt 9, which is cooled at the surface of the silicon melt 9, returns to the bottom of the quartz crucible 3A at the center of the quartz crucible 3A, causing a convection flow in a descending direction.

When the convection flow that ascends in the outer periphery of the outer periphery and descends at the center thereof occurs, a position of the downward flow randomly shifts to be offset from the center due to instability of thermal convection.

When the horizontal magnetic field is applied in the state of FIG. 3(A), rotation of the downward flow, which is gradually restrained as viewed from above the quartz crucible 3A, is restrained at a position most remote from the position of the magnetic field line at the center of the horizontal magnetic field as shown in FIG. 3(B).

Figure 3:
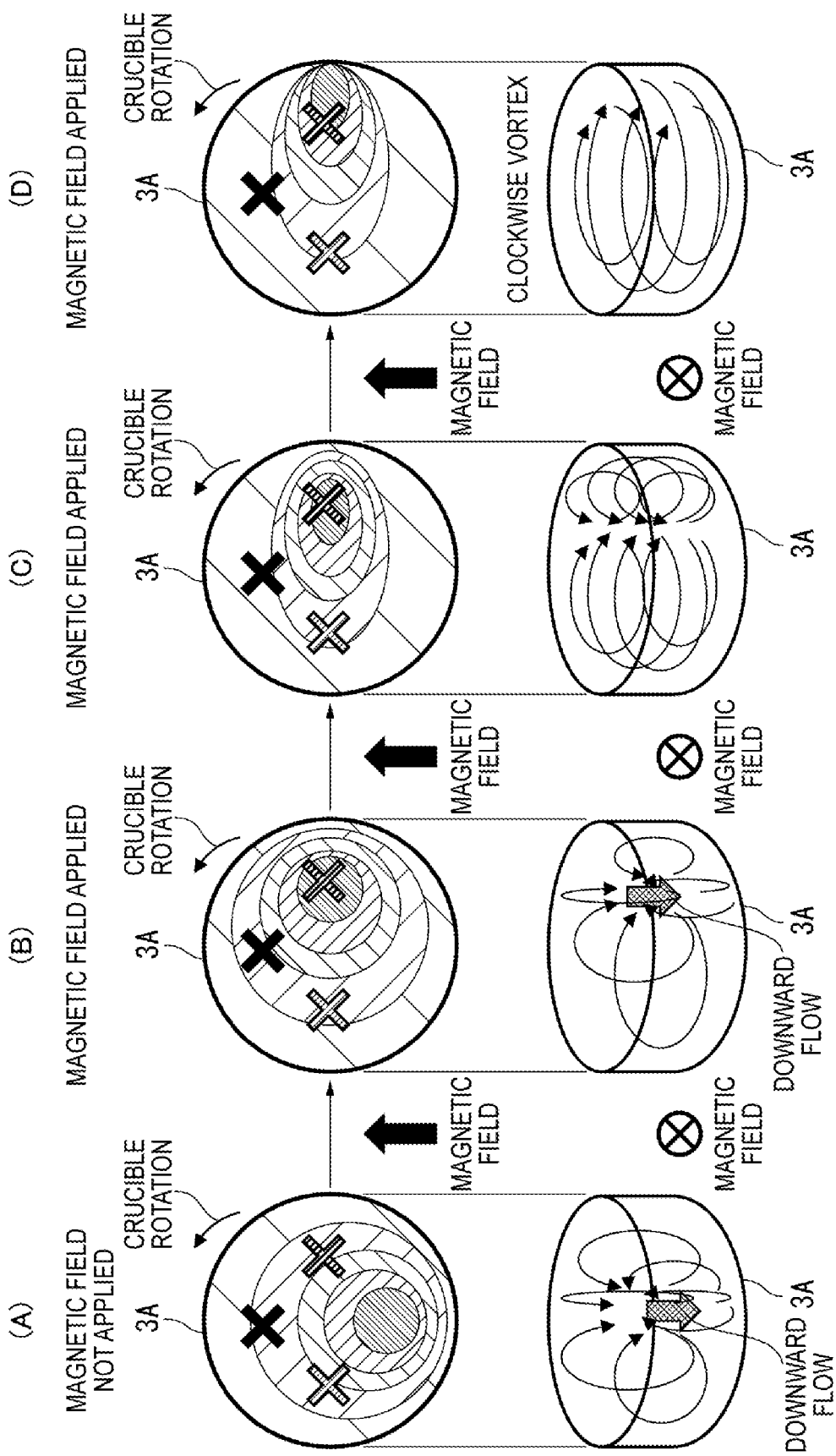

When the intensity of the horizontal magnetic field is increased while keeping this state, the magnitude of the convection flow in the ascending direction on the right side and the left side of the downward flow changes as shown in FIG. 3 (C), where the upward convection flow on the left side of the downward flow becomes dominant.

Finally, the convection flow in the ascending direction on the right side of the downward flow disappears as shown in FIG. 3(D), where the convection flow flows upward (i.e. in the ascending direction) on the left side and downward (i.e. in the descending direction) on the right side to create the clockwise convection flow.

In contrast, if a start position of the downward flow in FIG. 3(A) is shifted by 180 degrees in the rotation direction of the quartz crucible 3A, the downward flow is restrained at a position on the left side where a phase is shifted by 180 degrees from that in FIG. 3(C), resulting in the anticlockwise convection flow.

Accordingly, the inventors speculated that the clockwise/anticlockwise convection flow in combination with the axis-asymmetric configuration of the in-furnace environment of the pull-up device 1 caused the variation in the oxygen concentration in the monocrystalline silicon 10.

From the above, the inventors have reached an idea that the oxygen concentration in the monocrystalline silicon 10 can be highly accurately estimated by measuring the surface temperature of the liquid surface of the silicon melt 9 to determine the direction of the convection flow of the silicon melt 9, considering the plane-asymmetric arrangement of in-furnace environment of the pull-up device 1.

[3] Oxygen Concentration Estimation Method of Monocrystalline Silicon

Figure 4:
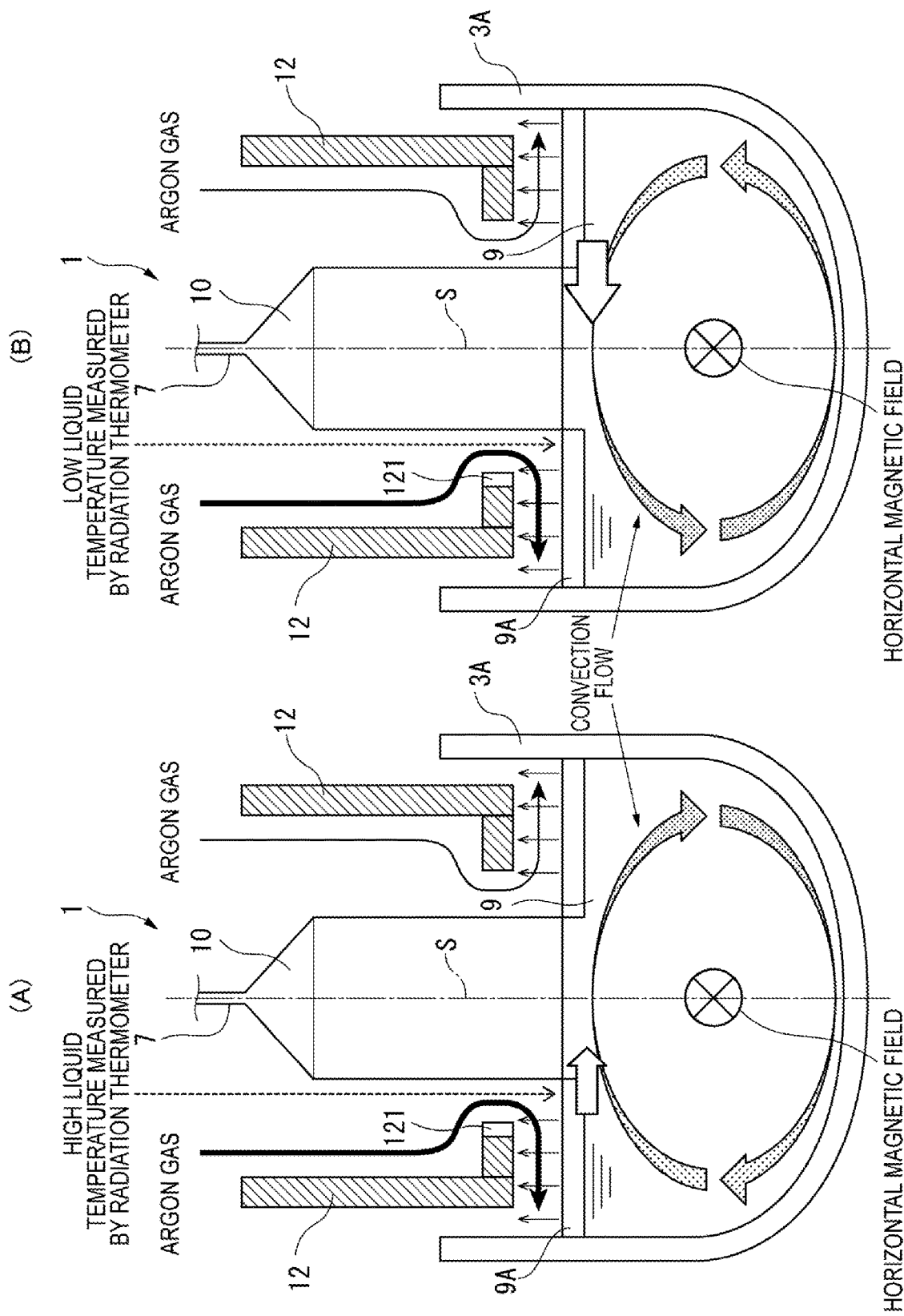

FIG. 4 shows a relationship between the rotation direction of the convection flow of the silicon melt 9 and a plane-asymmetric hot zone configuration of the pull-up device 1. As described above, the cut portion 121 is provided on one side of the heat shield 12 of the pull-up device 1. Specifically, the pull-up device 1 has a hot zone that is plane-asymmetric with respect to the plane S defined by the crystal pull-up shaft 7 and the application direction of the horizontal magnetic field, the plane-asymmetric hot zone configuration being achieved by the cut portion 121.

As shown in FIGS. 4(A) and 4(B), the radiation thermometer 15 is configured to measure the surface temperature of a part of the silicon melt 9 near the part provided with the cut portion 121.

During the step for pulling up the monocrystalline silicon 10 while applying the magnetic field after the solid polysilicon is melted, when the heat shield 12 provided with the cut portion 121 is placed near the monocrystalline silicon 10, the gas flow rate becomes uneven in the furnace due to the presence of the cut portion 121. The argon gas increases its flow rate and flow speed at the cut portion 121 of the heat shield 12.

It is believed that a surface layer of the silicon melt 9, from which oxygen evaporates, becomes a low-oxygen-concentration region 9A while the monocrystalline silicon 10 is being pulled up.

In the state shown in FIG. 4(A), where the direction of the convection flow in the silicon melt 9 is clockwise and the argon gas whose flow rate and speed are increased due to the presence of the cut portion 121 flows opposite to a flow for moving the low-oxygen-concentration region 9A toward the monocrystalline silicon 10, the monocrystalline silicon 10 becomes less likely to absorb the low-oxygen-concentration region 9A, exhibiting high oxygen concentration.

In contrast, in the state shown in FIG. 4(B), where the direction of the convection flow in the silicon melt 9 is anticlockwise and the argon gas whose flow rate and speed are increased due to the presence of the cut portion 121 flows in the same direction as the flow for moving the low-oxygen-concentration region 9A toward the monocrystalline silicon 10, the monocrystalline silicon 10 becomes likely to absorb the low-oxygen-concentration region 9A, exhibiting low oxygen concentration.

Figure 5:
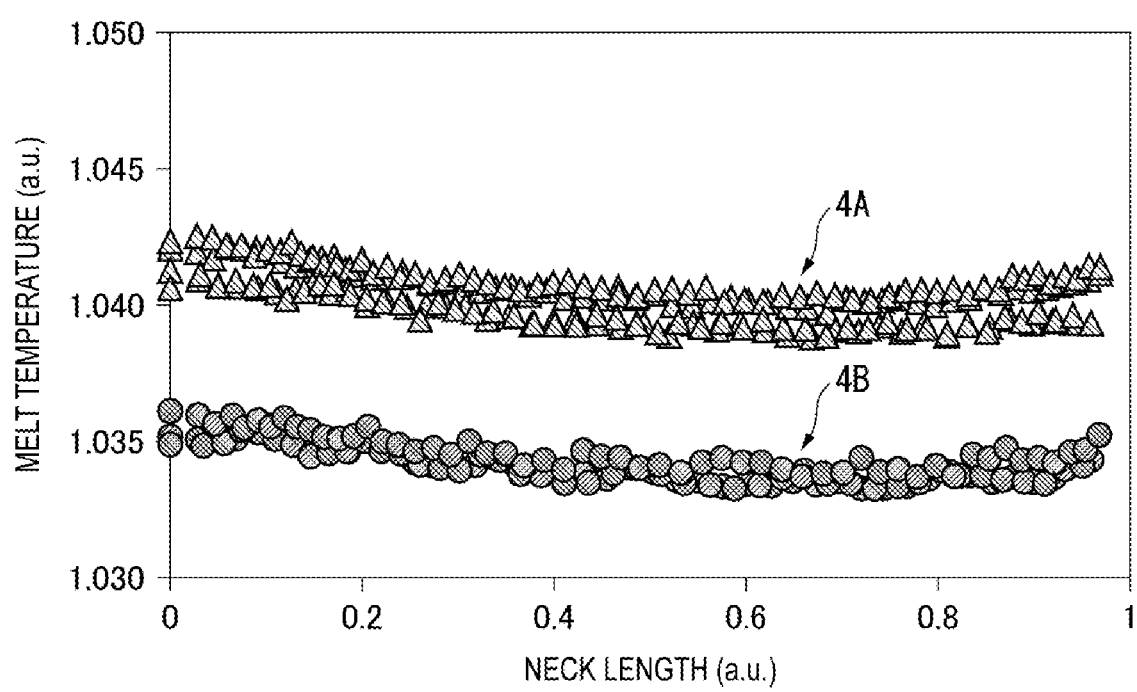
FIG. 5 is a graph showing a relationship between a neck length and a temperature of the silicon melt in the first exemplary embodiment.

It is confirmed as shown in FIG. 5 that there is a clear difference in the surface temperature of the silicon melt 9 as measured by the radiation thermometer 15 depending on the difference in the direction of the convection flow (i.e. clockwise or anticlockwise) in the silicon melt 9 during the neck-formation step of the monocrystalline silicon 10. The sign 4A in FIG. 5 indicates the clockwise convection flow shown in FIG. 4(A) and the sign 4B indicates the anticlockwise convection flow shown in FIG. 4(B). Thus, it is confirmed that the direction of the convection flow in the silicon melt 9 (i.e. clockwise or anticlockwise) can be determined by measuring the surface temperature of the silicon melt 9.

Figure 6:
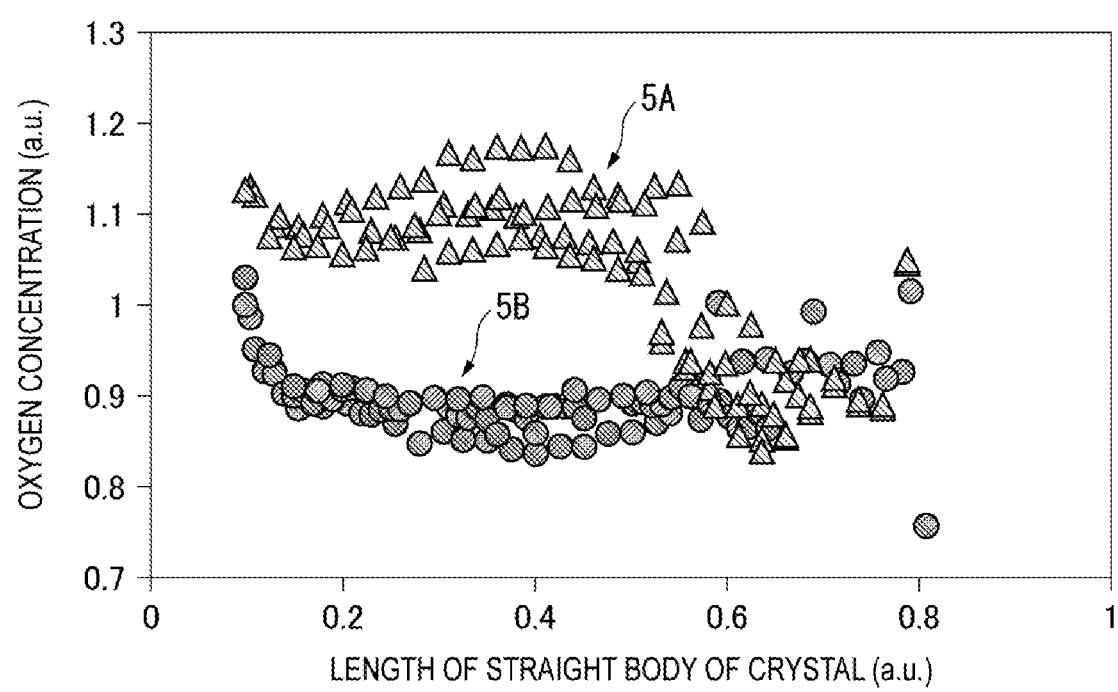
FIG. 6 is a graph showing a relationship between a length of a straight body and an oxygen concentration in monocrystalline silicon in the first exemplary embodiment.

When the oxygen concentration in the straight body of the monocrystalline silicon 10 was measured based on the surface temperature of the silicon melt 9 measured during the neck-formation step by FTIR (Fourier Transform Infrared Spectroscopy), it was found that a difference is caused in the oxygen concentration in the straight body as shown in FIG. 6. The sign 5A in FIG. 6 indicates the clockwise convection flow shown in FIG. 4(A) and the sign 5B indicates the anticlockwise convection flow shown in FIG. 4(B).

Accordingly, it was confirmed that the oxygen concentration in the straight body of the pulled-up monocrystalline silicon 10 could be highly accurately estimated by measuring the surface temperature of the silicon melt 9 during the neck-formation step with reference to the relationship shown in FIGS. 5 and 6. It should be noted that the surface temperature of the silicon melt 9, which is measured during the neck-formation step in the exemplary embodiment, is optionally measured otherwise according to the invention. For instance, the surface temperature of the silicon melt 9 near the cut portion 121 is measured during the shoulder-formation step of the monocrystalline silicon 10 in some embodiments. In sum, the invention is applicable as long as the surface temperature of the silicon melt 9 near the cut portion 121 is measurable by the radiation thermometer 15.

[4] Manufacturing Method of Monocrystalline Silicon

Figure 7:
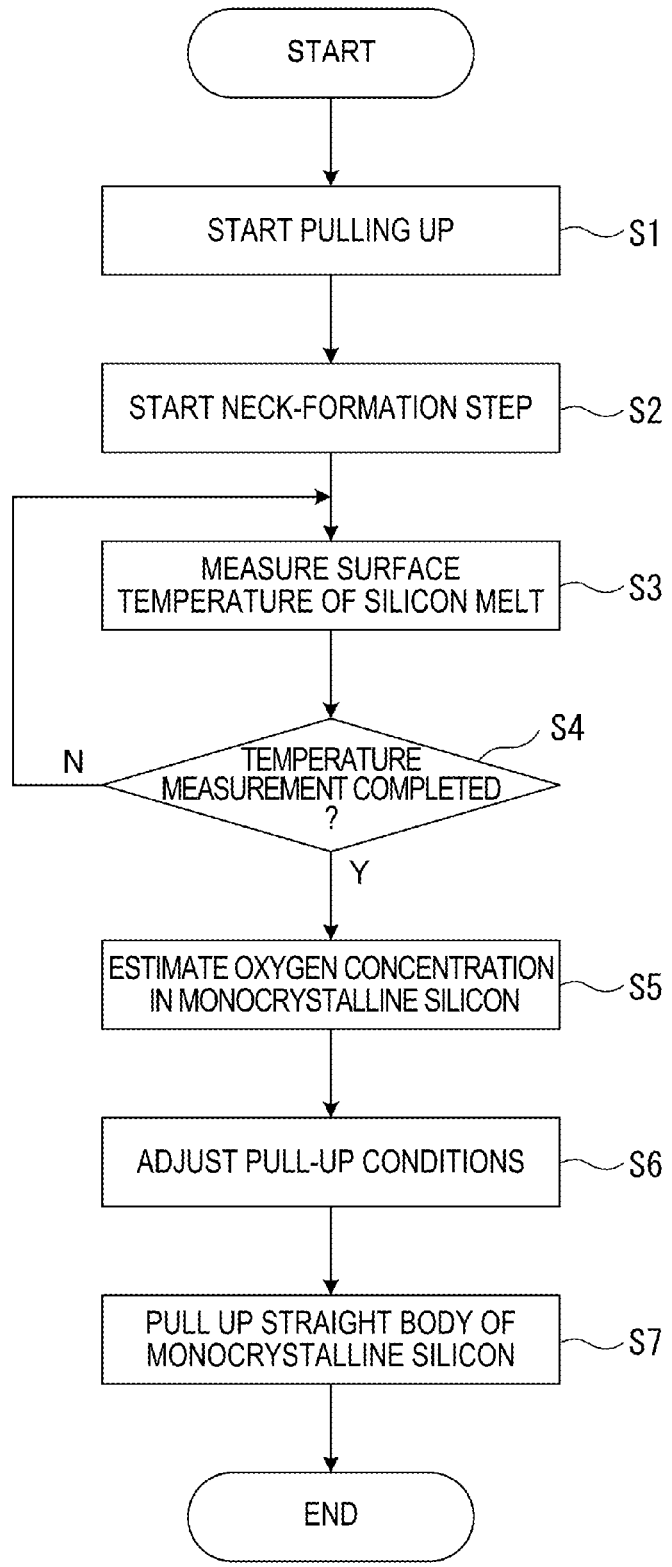
FIG. 7 is a flowchart showing a method of estimating the oxygen concentration in the monocrystalline silicon in the first exemplary embodiment.

Next, a manufacturing method of monocrystalline silicon in the exemplary embodiment will be described with reference to the flowchart shown in FIG. 7.

In the above-described pull-up device 1 of monocrystalline silicon, the seed crystal 8 is dipped into the silicon melt 9 to start pulling up the monocrystalline silicon 10 (Step S1).

When the seed crystal 8 becomes compatible with the silicon melt 9, the neck-formation step is started where the diameter of the seed crystal is reduced while the seed crystal 8 is pulled upward (Step S2).

Simultaneously with the start of the neck-formation step, the surface temperature of the silicon melt 9 near the cut portion 121 of the heat shield 12 is measured by the radiation thermometer 15 (Step S3).

The surface temperature measurement of the silicon melt 9 is continuously performed until the end of the neck-formation step (Step S4).

When the temperature measurement of the silicon melt 9 is ended, the oxygen concentration in the monocrystalline silicon 10 is estimated based on the graphs shown in FIGS. 5 and 6, which are prepared in advance (Step S5).

When the oxygen concentration in the pulled-up monocrystalline silicon 10 is estimated, pull-up conditions for the straight body of the monocrystalline silicon 10 are adjusted so that the oxygen concentration falls within product standards (Step S6). Specifically, the pull-up conditions are adjusted by turning a rotation speed of the crucible 3, argon gas flow rate, and pressure in the furnace.

After the adjustment of the pull-up conditions is ended, the straight body of the monocrystalline silicon 10 is started being pulled up (Step S7).

[5] Functions and Effects in First Exemplary Embodiment

According to the first exemplary embodiment, the oxygen concentration in the pulled-up monocrystalline silicon 10 can be estimated only by measuring the surface temperature of the silicon melt 9 by the radiation thermometer 15. Specifically, the oxygen concentration in the pulled-up monocrystalline silicon 10 can be highly accurately estimated by the temperature measurement performed after the start of the pull-up process of the monocrystalline silicon 10 and during the neck-formation step and the shoulder-formation step.

Accordingly, the monocrystalline silicon 10 whose oxygen concentration falls within the product standards can be pulled up by adjusting the pull-up conditions before the straight body of the monocrystalline silicon 10 is pulled up.

The plane-asymmetric hot zone configuration of the pull-up device 1 of the monocrystalline silicon is achieved by providing the cut portion 121 in the heat shield 12. Accordingly, the point on the surface of the silicon melt 9, whose temperature is measured by the radiation thermometer 15, is easily visually recognizable, facilitating the surface temperature measurement of the silicon melt 9.

[6] Second Exemplary Embodiment

Next, a second exemplary embodiment of the invention will be described. In the following description, the same reference numerals will be given to the components already described and the description thereof will be omitted.

The plane-asymmetric hot zone configuration of the pull-up device 1 of the monocrystalline silicon according to the above-described first exemplary embodiment is achieved by providing the cut portion 121 in the heat shield 12.

In contrast, the plane-asymmetric hot zone configuration of a pull-up device 1A of monocrystalline silicon according to the second exemplary embodiment is achieved by providing a thick portion 122 at a part of a lower part of the heat shield 12 as shown in FIG. 8.

A gap between a lower end of the heat shield 12 and the liquid surface of the silicon melt 9 at the thick portion 122 is smaller than that at other part of the heat shield 12. With the smaller gap at the thick portion, the flow rate and flow speed of the argon gas increase at the opposite part not provided with the thick portion 122, creating a flow opposite to a direction for the low-oxygen-concentration region 9A on the surface of the silicon melt 9 to move toward the monocrystalline silicon 10. Accordingly, the monocrystalline silicon 10 is less likely to absorb the low-oxygen-concentration region 9A, resulting in high oxygen concentration.

Thus, the above-described second exemplary embodiment offers the same functions and effects as described above.

Example(s)

Next, Examples of the invention will be described. It should be noted that the invention is by no means limited to Examples.

Three pieces of monocrystalline silicon 10 were pulled up using the pull-up device 1 of monocrystalline silicon according to the first exemplary embodiment. The surface temperatures of the silicon melts 9 near the cut portion 121 measured by the radiation thermometer 15 during the neck-formation step were as shown in FIG. 9.

As shown in FIG. 9, the surface temperature of the silicon melt 9 was at a high level during the neck-formation step in Experimental Example A. In contrast, the surface temperature of the silicon melt 9 was at a low level during the neck-formation step in each of Experimental Examples B and C.

It was estimated that the convection flow of the silicon melt 9 was clockwise as shown in FIG. 4(A) in Experimental Example A, so that the oxygen concentration in the monocrystalline silicon 10 became high.

In contrast, it was estimated that the convection flow of the silicon melt 9 was anticlockwise as shown in FIG. 4(B) in each of Experimental Examples B and C, so that the oxygen concentration in the monocrystalline silicon 10 became low. Accordingly, the pressure in the furnace during the pulling-up process was set higher in Experimental Example B than those in Experimental Example A and Experimental Example C as shown in FIG. 10. Further, the rotation speed of the crucible during the pulling-up process was also set higher in Experimental Example B than those in Experimental Example A and Experimental Example C as shown in FIG. 11.

The measurements of oxygen concentrations of the pulled-up pieces of monocrystalline silicon 10 are shown in FIG. 12.

As estimated, the oxygen concentration was high in Experimental Example A. As estimated, the oxygen concentration was low in Experimental Example C.

It is confirmed that the oxygen concentration in Experimental Example B, where the pressure in the furnace and the rotation speed of the crucible were adjusted, was improved as compared with that in Experimental Example C.

From the above, it is confirmed that the monocrystalline silicon pull-up device 1 with plane-asymmetric configuration allows the estimation of the oxygen concentration in the pulled-up monocrystalline silicon 10 by measuring the surface temperature of the silicon melt 9 near the cut portion 121 by the radiation thermometer 15.

Further, it is confirmed that the oxygen concentration in the pulled-up monocrystalline silicon 10 can be adjusted by adjusting the pull-up conditions (e.g. the pressure in the furnace, the rotation speed of the crucible) after the estimation.

The invention claimed is:

1. A method of estimating an oxygen concentration in monocrystalline silicon, the method comprising:
   pulling up the monocrystalline silicon from a silicon melt in a quartz crucible while applying a horizontal magnetic field to the silicon melt, the monocrystalline silicon being pulled up by a pull-up device comprising a heat shield with a plane-asymmetric arrangement with respect to a plane defined by a crystal pull-up shaft and an application direction of the horizontal magnetic field, the monocrystalline silicon being pulled up while flowing an inert gas so that a convection flow in the silicon melt is accelerated or canceled below a point defining the plane-asymmetric arrangement of the heat shield;
   in at least one of a neck-formation step or a shoulder-formation step of the monocrystalline silicon, measuring a temperature of a surface of the silicon melt below the point defining the plane-asymmetric arrangement of the heat shield; and
   estimating the oxygen concentration in a straight body of the pulled-up monocrystalline silicon based on the measured temperature of the surface of the silicon melt and a predetermined relationship between the temperature of the surface of the silicon melt and the oxygen concentration in the monocrystalline silicon.

2. The method according to claim 1, wherein the plane-asymmetric arrangement of the heat shield is achieved by providing a cut portion in a part of the heat shield spaced from the surface of the silicon melt.

3. The method according to claim 1, wherein the plane-asymmetric arrangement of the heat shield is achieved by changing a height of a part of the heat shield spaced from the surface of the silicon melt.

4. A method of manufacturing monocrystalline silicon by pulling up the monocrystalline silicon from a silicon melt in a quartz crucible while applying a horizontal magnetic field to the silicon melt, the method comprising:
performing the method of estimating an oxygen concentration in monocrystalline silicon according to claim 1; and
pulling up the monocrystalline silicon after adjusting at least one of a rotation speed of the quartz crucible of the pull-up device, a flow rate of inert gas, or a pressure in a furnace based on the estimated oxygen concentration in the monocrystalline silicon.

\* \* \* \* \*